US008779782B2

(12) United States Patent
Aubry et al.

(10) Patent No.: US 8,779,782 B2
(45) Date of Patent: Jul. 15, 2014

(54) OBJECT DETECTION DEVICE FOR AN AUTOMOTIVE VEHICLE

(75) Inventors: Jean-Marcel Aubry, Bourogne (FR); Thomas W Bach, Brighton (GB)

(73) Assignee: Faurecia Bloc Avant, Nanterre (FR)

( * ) Notice: Subject to any disclaimer, the term of this patent is extended or adjusted under 35 U.S.C. 154(b) by 366 days.

(21) Appl. No.: 13/124,792

(22) PCT Filed: Oct. 17, 2008

(86) PCT No.: PCT/IB2008/055343
§ 371 (c)(1),
(2), (4) Date: Jul. 28, 2011

(87) PCT Pub. No.: WO2010/043935
PCT Pub. Date: Apr. 22, 2010

(65) Prior Publication Data
US 2011/0273194 A1    Nov. 10, 2011

(51) Int. Cl.
*G01R 31/08* (2006.01)
*G01R 27/26* (2006.01)
*H03K 17/955* (2006.01)
*G01D 5/24* (2006.01)
*G01R 31/312* (2006.01)

(52) U.S. Cl.
USPC ............. 324/686; 324/519; 324/658

(58) Field of Classification Search
CPC ............. H03K 17/955; H03K 2217/960775; H03K 17/962; G01D 5/24; G01R 31/312; G01R 31/924
USPC ............. 324/686, 519, 750.17, 658, 661, 660
See application file for complete search history.

(56) References Cited

U.S. PATENT DOCUMENTS

| 5,936,412 A | 8/1999 | Gershenfeld et al. |
| 6,292,001 B1 | 9/2001 | Sasaki et al. |
| 7,560,938 B2 | 7/2009 | Van Berkel et al. |
| 2007/0159178 A1* | 7/2007 | Stanley et al. ............. 324/457 |

FOREIGN PATENT DOCUMENTS

| EP | 0945984 B1 | 9/1999 |
| GB | 2255641 A | 11/1992 |
| JP | 05139225 A1 | 6/1993 |
| JP | 200050550 | 5/2000 |
| JP | 2000146508 | 5/2000 |
| JP | 2001050704 | 2/2001 |
| JP | 2003202383 | 7/2003 |
| JP | 2006112959 | 4/2006 |
| JP | 2006525635 | 11/2006 |
| JP | 2012506042 | 3/2012 |
| WO | 9014604 | 11/1990 |
| WO | 2010043936 | 4/2010 |

* cited by examiner

*Primary Examiner* — Melissa Koval
*Assistant Examiner* — Farhana Hoque
(74) *Attorney, Agent, or Firm* — Davidson, Davidson & Kappel, LLC

(57) ABSTRACT

A detection device for detecting an object by measuring the capacitance variation of the detection device includes at least a pair of sensor pads, each sensor pad being able to transmit or to receive an electric field. Each sensor pad can be used to measure the impedance variation of the pad, each sensor pad being driven by a driven rail impedance measuring system including an inverter, an oscillator, a power supply rail driver and switches, the measuring system being able to change the sensor pad function from electric field transmitter to electric field receiver or impedance measurer by turning on and off the oscillator to the input of the power supply rail driver of the inverter.

12 Claims, 3 Drawing Sheets

OBJECT DETECTION DEVICE FOR AN AUTOMOTIVE VEHICLE

The present invention relates to a detection device of the type for detecting an object in a detection area near an automotive vehicle by measuring the capacitance variation of said detection device caused by the presence of an object in the detection area, said device comprising at least a pair of sensor pads, each sensor pad being able to transmit or to receive an electric field and means for measuring the coupling capacitance between the pads.

The invention also relates to an exterior trim part comprising such a detection device and to an automotive vehicle comprising such an exterior trim part.

BACKGROUND

Such devices are known and are for example used to assist a driver to park its car by informing said driver of the vicinity of obstacles surrounding the vehicle. Generally, such a detection device informs the driver of the presence of obstacles around the vehicle during driving.

Such devices generally use pairs of sensor pads able to transmit and to receive an electric field. The coupling capacitance between the sensor pads of a pair of sensor pads is measured and the variation of said coupling capacitance indicates the presence of an object in the detection area.

SUMMARY OF THE INVENTION

However, if the object in the detection area is small or gets near a transmitter or receiver pad, the received signal can increase due to the coupling of the object with the pad. This can result in that the presence of a small object or of an object near the automotive vehicle is not detected. This can also result in large differences of the detection range in function of the size of the object present in the detection area.

Furthermore, to acquire a data set enabling to determine the presence of an object in the detection area, the different sensor pads are "scanned". The speed of the scanning and the accuracy of the data set can be limited by noise glitches generated by the switching involved in the scanning process.

Other problems occur in the known detection devices, such as the detection of the variation of the height of the road relative to the automotive vehicle which can be perceived as an object in the detection area.

An object of the invention provides a detection device which can efficiently sense the presence of an object in a detection area, whatever the size of said object is.

The present invention provides a detection device for detecting an object in a detection area near an automotive vehicle by measuring the capacitance variation of said detection device caused by the presence of an object in the detection area, said device comprising at least a pair of sensor pads, each sensor pad being able to transmit or to receive an electric field and means for measuring the coupling capacitance between the pads, wherein each sensor pad can be further used to measure the impedance variation of said pad in order to determine the presence of an object in the detection area, each sensor pad being driven by a driven rail impedance measuring system comprising an inverter, an oscillator, a power supply rail driver with two DC voltage offset follower amplifier outputs for the power supply rails of the inverter and switches, said driven rail impedance measuring system being able to change the sensor pad function from electric field transmitter to electric field receiver or impedance measurer by turning on and off the oscillator drive to the input of the power supply rail driver of the inverter.

Each sensor pad may be used to measure its impedance variation and act as an electric field transmitter or receiver may enhance the detection ability of the detection device. Small objects may be easily detected as well as objects close to the sensor pads. Furthermore, the driven rail impedance measuring system, which selects the functionality of the sensor pads (impedance measurer, transmitter or receiver), with no multiplexer in the input lines, helps to eliminate glitches and enhance the data set acquisition process.

The detection device may include one or more of the following features:
- the detection device comprises more than one pair of sensor pads, the pairs of sensor pads being driven at different frequencies so that the measure of the coupling capacitance between the pads of a pair of sensor pads or the measure of the impedance variation can be performed simultaneously for all the pairs of sensor pads;
- the driven rail impedance measuring system comprises three switches forming a line connected to the input of the power supply rail driver, a first switch being connected to the input of the power supply rail driver, a second switch being connected to the oscillator and a third switch being connected to a ground, the third switch being interposed between the first and the second switches, so that when the first and second switches are closed and the third switch is open, the oscillator is connected to the input of the power supply rail driver and the sensor pad functions as a electric field transmitter, and when the first and second switches are open and the third switch is closed, the sensor pad functions as an electric field receiver;
- the detection device comprises at least a conductive area disposed between the sensor pads of a pair of sensor pads, said conductive area being connected to a ground; and
- a conductive area is disposed around each sensor pad, said conductive area being driven at the same or at a greater fractional AC signal amplitude, phase and frequency that is used to drive said sensor pad.

The present invention also provides an exterior trim part for an automotive vehicle, comprising a detection device for detecting an object in a detection area near an automotive vehicle on which said exterior trim part is mounted, wherein the detection device is as described above.

The exterior trim part may include one or more of the following features:
- the detection device comprises at least two pairs of sensor pads, one pair being disposed in the upper part of the exterior trim part and the other pair being disposed in the lower part of the exterior trim part, the coupling capacitance between the sensor pads of each pair of sensor parts being measured to determine the presence of an object in the detection area;
- the detection device further comprises an other pair of sensor pads, said pair of sensor pads being disposed in the upper part of the exterior trim part;
- the pair of sensor pads disposed in the lower part of the exterior trim part is arranged to calibrate the detection device in order to take into consideration the variation of height of the ground relative to the exterior trim part;
- the detection device is fixed to the inner face of the exterior trim part;
- the detection device is overmoulded by the material of the exterior trim part; and a conductive layer is disposed on the outer face of the exterior trim part.

The present invention also provides an automotive vehicle comprising at least an exterior trim part as described above.

BRIEF DESCRIPTION OF THE DRAWINGS

Other aspects and advantages of the invention will appear by reading the following description, given by way of example and made in reference to the accompanying drawings, wherein.

DETAILED DESCRIPTION

In the description, the terms "inner", "outer", "front", "rear" etc. are defined relative to the usual directions in a mounted automotive vehicle.

Figure 1:
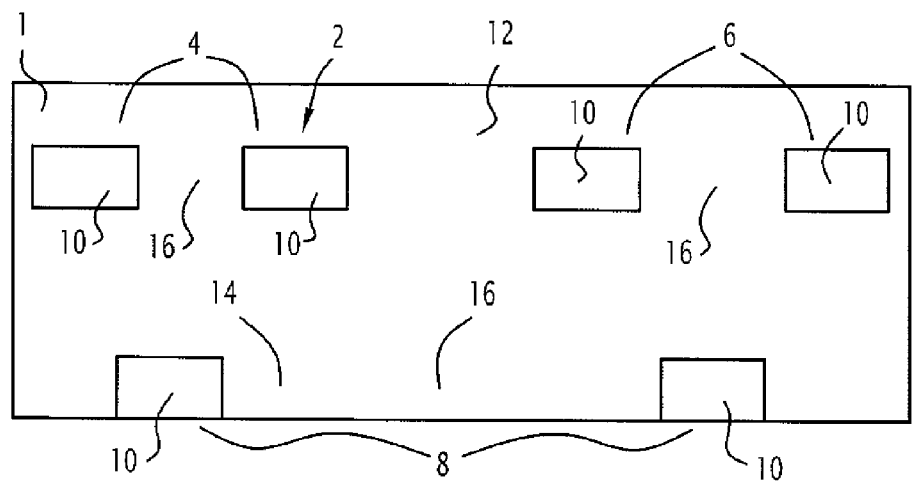
FIG. 1 is a view of part of an exterior trim part comprising a detection device according to the present invention with several pairs of sensor pads.

With reference to FIG. 1, there is described an exterior trim part 1 to be mounted on the front or on the rear of an automotive vehicle. The exterior trim part is for example a bumper. The invention can be applied to the front as well as to the rear of an automotive vehicle. The detection device being especially advantageous when installed to the front and to the rear of the automotive vehicle in order to provide a larger detection area. The detection device can also be installed on the sides of the automotive vehicle in order to provide a larger detection area. Generally, the invention can be applied to any exterior trim parts of the automotive vehicle, including fascia. The invention can also be applied to other field than the automotive industry, when the detection of objects or targets is needed, such as in tomography. The invention will now be described for a detection device for detecting an object in a detection area near an automotive vehicle.

A detection device 2 is fixed to the exterior trim part 1, on the rear side thereof as shown in FIG. 1. Alternatively, the detection device 2 can be overmoulded by the exterior trim part 1, i.e. the detection device 2 is placed in the material forming the exterior trim part.

The detection device 2 is arranged to detect the presence of an object 3 in a detection area extending in front of the exterior trim part 1, i.e. around the automotive vehicle.

In the embodiment shown in FIG. 1, the detection device 2 comprises three pairs 4, 6 and 8 of sensor pads 10, i.e. six sensor pads 10. Two pairs 4 and 6 are arranged in an upper part 12 of the exterior trim part 1 and a pair 8 is arranged in the lower part 14 of the exterior trim part 1. The sensor pads 10 of a pair of sensor pads are separated by a space 16. As shown in FIG. 1, the two pairs of sensor pads 4 and 6 are arranged so that a pair 4 is disposed on the left side of the exterior trim part 1, with one of its sensor pads 10 disposed at an end portion of the trim part 1, and the other pair 6 is disposed on the right side of the trim part 1, with one of its sensor pads 10 disposed at the other end portion of the trim part 1. The pair 8 arranged in the lower part 14 of the trim part 1 has one of its sensor pads 10 disposed in the vicinity of an end portion of the trim part 1 and its other sensor pad 10 disposed in the vicinity of the other end portion of the trim part 1. Therefore, the detection device 2 substantially "covers" all the exterior trim part 1.

The number and the arrangement of the pairs of sensor pads 10 can be changed depending on the application and on the size of the trim part 1.

Figure 4:
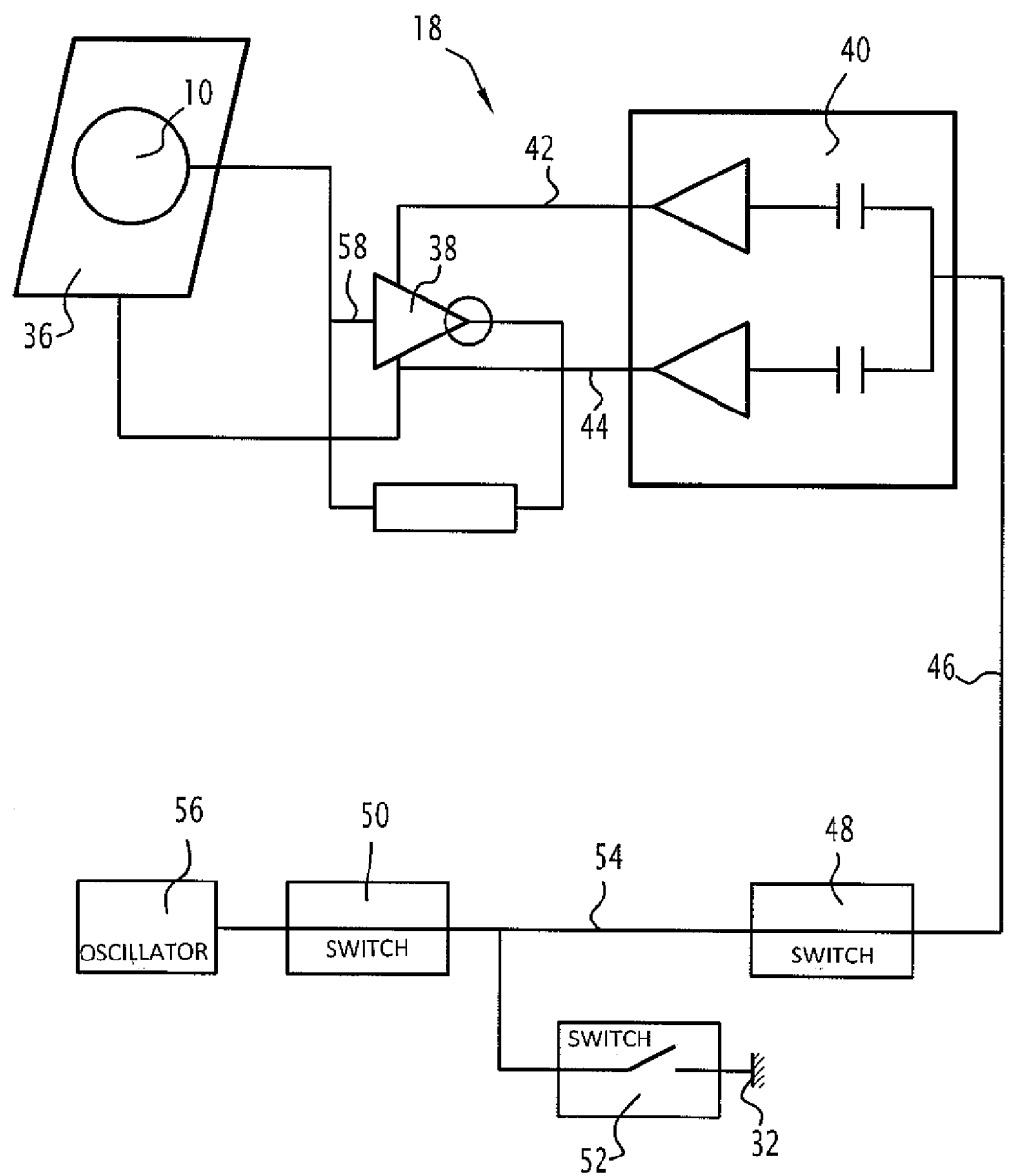
FIG. 4 is a schematic drawing of a driven rail impedance measuring system for controlling the detection device according to the present invention.

Each sensor pad 10 is made from a conductive material and is connected to a driven rail impedance measuring system 18, represented in FIG. 4, for controlling the detection device 2. The driven rail impedance measuring system 18 provides driving signals to the detection device 2, as will be described later.

Each sensor pad 10 can function as an electric field transmitter 20, as an electric field receiver 22 or as an impedance measurer 24, the selection of the function of the sensor pad 10 being controlled by the driven rail impedance measuring system 18 as will be described later.

Figure 2:
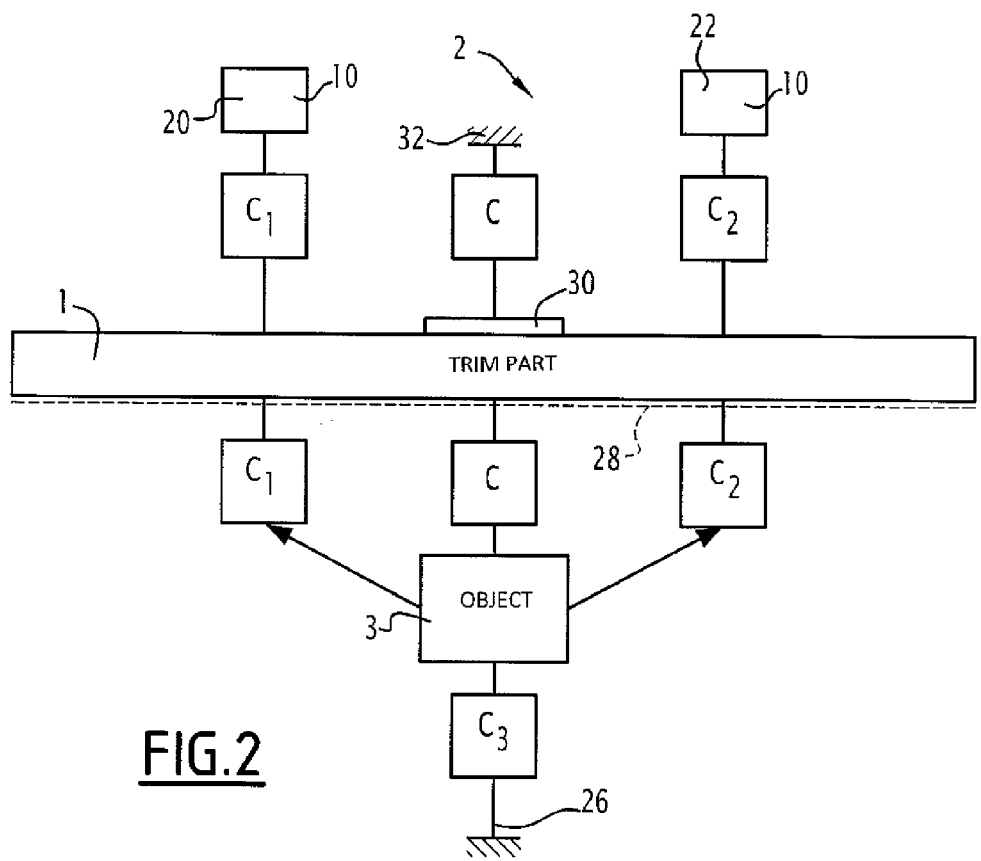
FIG. 2 is an equivalent circuit illustrating the functioning of the detection device when a pair of sensor pads is used as electric field transmitter and receiver.

In reference to FIG. 2, the functioning of the detection device 2 when a pair of sensor pads 10 is used as electric field transmitter 20 and receiver 22 will now be described. One sensor pad is selected to function as an electric field transmitter 20 and the other sensor pad is selected to function as an electric field receiver 22. The coupling capacity between the transmitter 20 and the receiver 22 is measured to determine the presence of an object 3 in the detection area.

When no object is present in the detection area, the transmitter 20 and the receiver 22 are equivalent to two capacities $C_1$ and $C_2$ in series, the coupling capacitance between the transmitter and the receiver has a fixed predefined value.

When an object 3 penetrates in the detection area, said object is equivalent to a capacity $C_3$ connected on one hand to the ground 26 and on the other hand to the capacity $C_1$ of the transmitter 20 and to the capacity $C_2$ of the receiver 22. The more the object 3 approaches the exterior trim part 1, the more $C_3$ increases, thereby making the coupling capacitance between the transmitter and the receiver vary; which enables to detect the presence of the object in the detection area.

Figure 3:
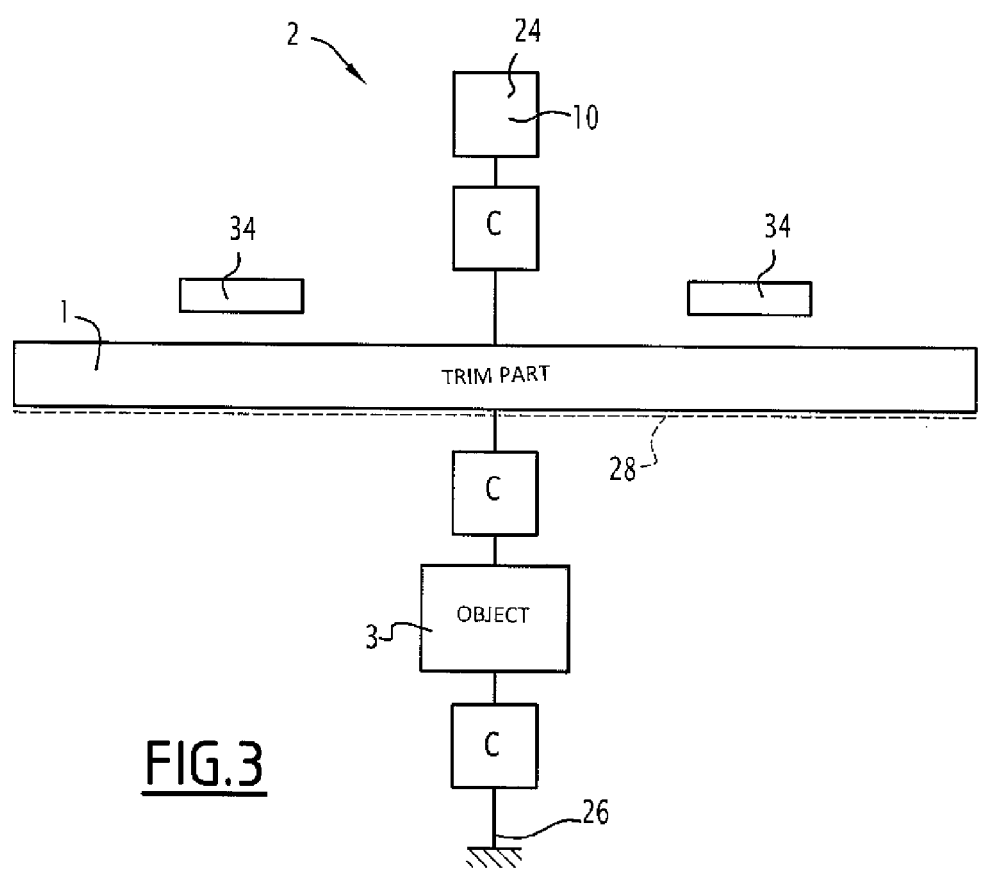
FIG. 3 is an equivalent circuit illustration the functioning of the detection device when a single sensor pad is used as an impedance measurer.

However, when the object 3 is small or gets near a transmitter or receiver pad, the received signal can increase due to the coupling of the object with the pad. This can result in that the presence of a small object or of an object near the automotive vehicle is not detected. This can also result in large differences of the detection range in function of the size of the object present in the detection area. In order to detect such a small or close object 3, the sensor pads 10 each can be used as an impedance measurer 24 as shown in FIG. 3.

In this case, a pad 10 is driven in a way so that the individual complex impedance to the environment can be measured. As can be seen in FIG. 3, the object 3 increases the capacitive coupling (represented by the capacities C in FIG. 3) between the sensor pad 10 and ground 26. Thus, the variation of the measured impedance indicates the presence of an object.

The combined use of sensor pads functioning as transmitter and receiver and pads functioning as impedance measurer enhance the detection ability and detection range of the detection device 2.

The pairs of sensor pads 10 are driven at different frequencies so that the measure of the coupling capacitance between the pads 10 of a pair of sensor pads 10 or the measure of the impedance variation for each pad can be performed simultaneously for all the sensor pads 10. This further increases the efficiency of the detection device 2. The signals acquired at different frequencies are fed to a synchronous demodulation device which enables to obtain the various data set obtained by the various pairs of sensor pads 10 simultaneously.

The pair 8 of sensor pads 10 arranged in the lower part 14 of the exterior trim part 1 is used to calibrate the detection device 2 relative to the ground. Indeed, the variation of height of the road on which the automotive vehicle travels can be considered as an object in the detection area if the detection device 2 is not calibrated to take this variation into consideration. This pair 8 of sensor pads 10 acquires a data set of the variations of height of the ground relative to the exterior trim part 1 so that the driver is not informed of these variations when the detection of the presence of an object in the detection area is carried out. This pair 8 of sensor pads 10 can also be used to detect the curbs in the road as the curb will give a steadily increasing difference between the data set acquired by the pairs 4 and 6 of sensor pads 10 arranged in the upper part 12 and the data set acquired by the pair 8 of sensor pads arranged in the lower part 14. The speed of the automotive vehicle is also taken into consideration and is monitored to help in the calculation of the differences of acquisition between the sensor pads 10 in upper part 12 and the sensor pads in the lower part 14.

In a painted exterior trim part 1, a conductive layer 28 is left on the outer face of the exterior trim part 1. Such a layer 28 is a conductive primer layer left on the surface of the exterior trim part by the electrostatic painting process used. The presence of this conductive layer 28 can cause the transmitter 20 to transmit a signal to the receiver 22 directly through the conductive layer 28 without sending a signal outside of the exterior trim part 1. The efficiency of the detection device 2 is then reduced. When an object is in the detection area, the change in the received signal will be fractionally much smaller than the received signal directly through the conductive layer 28. To overcome this problem, at least a conductive area 30 is disposed between the sensor pads 10 of a pair of sensor pads, the conductive area 30 being connected to a ground 32 of the automotive vehicle. This conductive area 30 shunts the field going across the conductive layer 28 so that it does not reach the receiver. Thus, the signal that reaches the receiver 22 has traveled away from the exterior trim part 1 and is therefore sensitive to the presence or the absence of an object 3 in the detection area.

When a pad 10 is used as an impedance measurer 24, the presence of the conductive layer 28 is also problematic. The field lines emitted by the pad 10 are shorted by the conductive layer 28 adding an extra capacitance that is not due to the presence of an object 3 in the detection area. In order to overcome this problem, a conductive area 34 is disposed around each sensor pad, the conductive area 34 being driven at the same or at a greater fractional AC signal amplitude, phase and frequency that is used to drive the sensor pad. For example, the conductive area 34 has the shape of a ring surrounding the sensor pad 10. The conductive area 34 couples to a ring area of the conductive layer 28 and makes this ring area follow the signal on the sensor pad 10 used as an impedance measurer.

A guard plate 36 (FIG. 4) is disposed behind and/or around each sensor pad 10 to make the sensor pad more sensitive in one direction, i.e. toward the exterior of the trim part 1.

The function of the pairs of sensor pads can be changed as desired in order to calculate the position and the distance of an object in the detection area with a known calculation module. The sensor pads 10 are "scanned" in order to acquire data sets of capacitances and/or impedances to determine the presence of an object. The position, the distance and the size of the object can be evaluated with the calculation module.

The driven rail impedance measuring system 18 will now be described in reference to FIG. 4.

The driven rail impedance measuring system 18 uses an inverter 38. The inverter 38 can be constructed from two opposite polarity drain connected enhancement mode MOS-FETs or from an operational amplifier with the non-inverting input based at some point between the rails. The guard plate 36 is connected to the VSS rail of the inverter 38. A power supply rail driver 40 has DC voltage offset outputs 42 and 44 to the VDD and VSS rails of the inverter 38.

The input 46 to the power supply rail driver 40 comes from a first switch 48 that is a part of a T arrangement of three switches 48, 50, 52 forming a line 54. The second switch 50 is connected to an oscillator 56 and the third switch 52 is connected to a ground 32 of the automotive vehicle. The third switch 52 is interposed between the switches 48 and 50. If the switches 48 and 50 are closed and the third switch 52 is open then the oscillator 56 is connected to the input 46 of the power supply rail driver 40 so that the DC voltage offset outputs 42 and 44 AC follow the oscillator 56. The third switch 52 is used to increase the isolation when the circuit is to be used as a receiver, i.e. when the rails are not to be driven, by connecting line 54 to 0V.

The virtual ground input 58 follows closely in an AC manner the inverter rails. This means the guard plane 36 can be driven by the VSS rail 44, or VDD rail or input 46 to rail driver 40, to reduce the effective capacitance between sensor pad 10 and guard plate 36.

When the first and second switches 48 and 50 are open, the oscillator 56 is no longer connected to the input 46 of the power supply rail driver 40. The third switch 52 is closed so that the line 54 connecting the second switch 50 to the first switch 48 is connected to the ground 32 through the third switch 52. This eliminates any feed through of the oscillator signal across the capacitance across the switch 48.

The system described above can measure, using long coaxial cables connected to the sensor pad 10, high frequencies and small capacitances without spurious oscillations than similar functioning accomplished by circuitry with multiplexers in front that have their power supply lines driven to make capacitances to the rails effectively small.

This way of selecting the functionality (impedance measurer, transmitter or receiver), without multiplexers in the input lines, eliminates glitches especially when done at zero crossing points with a fixed number of cycles of the transmitting oscillator. This effect may be achieved because the switching is done at low impedances and thus any glitches, which appear at relatively high impedance, generated by the capacitances of the switches will have a much smaller effect. The non-glitch performance increases the speed in which the different plates can be selected as transmitters or receivers.

The invention claimed is:

1. A detection device for detecting an object in a detection area of an automotive vehicle comprising:
  at least a pair of sensor pads, each sensor pad serving as an electric field transmitter, an electric field receiver and an impedance measurer; and
  a driven rail impedance measuring system including an inverter, an oscillator, a power supply rail driver with two DC voltage offset follower amplifier outputs for power supply rails of the inverter and a plurality of switches, the driven rail impedance measuring system changing a sensor pad function from the electric field transmitter to the electric field receiver or the impedance measurer by connecting or disconnecting the oscillator to or from an input of the power supply rail driver of the inverter;
  an object being detected in the detection area when there is a capacitance variation or an impedance variation between the sensor pads of the at least one pair.

2. The detection device according to claim 1, further comprising at least two pairs of sensor pads, the pairs of sensor pads being driven at different frequencies so that the measure of the coupling capacitance between the pads of a pair of sensor pads or the measure of the impedance variation can be performed simultaneously for all the pairs of sensor pads.

3. The detection device according to claim 1, wherein the plurality of switches includes three switches forming a line connected to the input of the power supply rail driver, a first switch is connected to the input of the power supply rail driver, a second switch is connected to the oscillator and a third switch is connected to a ground, the third switch is interposed between the first and the second switches, so that when the first and second switches are closed and the third switch is open, the oscillator is connected to the input of the power supply rail driver and the sensor pad functions as an electric field transmitter, and when the first and second switches are open and the third switch is closed, the sensor pad functions as an electric field receiver.

4. The detection device according to claim 1, further comprising at least a conductive area disposed between the sensor pads of a pair of sensor pads, the conductive area being connected to a ground.

5. The detection device according to claim 1, further comprising a conductive area disposed around each sensor pad, the conductive area being driven at a same or at a greater fractional AC signal amplitude, phase and frequency used to drive the sensor pad.

6. The exterior trim part for an automotive vehicle comprising:
a detection device for detecting an object in a detection area near an automotive vehicle as recited in claim 1, the exterior trim part being mounted on the automotive vehicle.

7. The exterior trim part according to claim 6, wherein the detection device comprises at least two pairs of sensor pads, one pair being disposed in an upper part of the exterior trim part and the other pair being disposed in a lower part of the exterior trim part, the coupling capacitance between the sensor pads of each pair of sensor pads being measured to determine the presence of an object in the detection area.

8. The exterior trim part according to claim 7, further comprising a further pair of sensor pads, the further pair of sensor pads being disposed in the upper part of the exterior trim part.

9. The exterior trim part according to claim 7, wherein the pair of sensor pads disposed in the lower part of the exterior trim part is arranged to calibrate the detection device as a function of a variation of a height of the ground relative to the exterior trim part.

10. The exterior trim part according to claim 6, wherein the detection device is fixed to an inner face of the exterior trim part.

11. The exterior trim part according to claim 6, wherein the detection device is over molded by a material of the exterior trim part.

12. The exterior trim part according to claim 6, wherein a conductive layer is disposed on an outer face of the exterior trim part.

* * * * *